United States Patent
Takeda

(10) Patent No.: US 10,406,689 B2
(45) Date of Patent: Sep. 10, 2019

(54) ROBOT SIMULATION APPARATUS THAT CALCULATES SWEPT SPACE

(71) Applicant: FANUC CORPORATION, Yamanashi (JP)

(72) Inventor: Toshiya Takeda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 43 days.

(21) Appl. No.: 15/429,445

(22) Filed: Feb. 10, 2017

(65) Prior Publication Data
US 2017/0232614 A1    Aug. 17, 2017

(30) Foreign Application Priority Data
Feb. 17, 2016  (JP) .................... 2016-027905

(51) Int. Cl.
*G06G 7/48* (2006.01)
*B25J 9/16* (2006.01)
*G06F 17/50* (2006.01)

(52) U.S. Cl.
CPC ........... *B25J 9/1671* (2013.01); *B25J 9/1676* (2013.01); *G05B 2219/35148* (2013.01); *G05B 2219/39097* (2013.01); *G05B 2219/40317* (2013.01); *G06F 17/5009* (2013.01)

(58) Field of Classification Search
None
See application file for complete search history.

(56) References Cited

U.S. PATENT DOCUMENTS

2007/0142967 A1    6/2007  Volcic et al.
2010/0292843 A1*  11/2010  Kariyazaki ............ B25J 9/1676
                                                    700/264
(Continued)

FOREIGN PATENT DOCUMENTS

DE      10361132 A1    1/2005
DE   102009040145 A1    3/2011
EP       2366504 B1    5/2015
(Continued)

OTHER PUBLICATIONS

Perrin, Nicolas et al. "Fast Humanoid Robot Collision Free Footstep Planning Using Sweep Volume Approximations", Apr. 2012, IEEE Transactions on Robotics, vol. 28, No. 2, IEEE. (Year: 2012).*
(Continued)

*Primary Examiner* — Cedric Johnson
(74) *Attorney, Agent, or Firm* — Hauptman Ham, LLP

(57) ABSTRACT

A simulation apparatus acquires a position and an operating speed in each drive axis of the robot at a set point set for each minute section of a motion path of the robot when an operation program of a robot is executed. The simulation apparatus comprises a stop position estimation part that estimates a stop position where the robot is stopped after moving by inertia in each dive axis, based on the position in each drive axis of the robot, the operating speed in each drive axis, and the weight of the work tool, when an emergency stop of the robot is performed at the set point. The simulation apparatus comprises a swept space calculation part that calculates a swept space of three-dimensional models of the robot and the work tool based on the stop position.

2 Claims, 9 Drawing Sheets

(56) References Cited

U.S. PATENT DOCUMENTS

| 2011/0060462 A1* | 3/2011 | Aurnhammer | B25J 9/1674 |
| | | | 700/255 |
| 2012/0022689 A1 | 1/2012 | Kapoor | |

FOREIGN PATENT DOCUMENTS

| EP | 2047955 B1 | | 6/2015 | |
| JP | 2003-300185 A | | 10/2003 | |
| JP | 2006-192554 A | | 7/2006 | |
| JP | 2006192554 A | * | 7/2006 | |
| JP | 2009-90403 A | | 4/2009 | |
| JP | 2009090403 A | * | 4/2009 | ............ B25J 9/1666 |
| JP | 2009-178842 A | | 8/2009 | |
| JP | 2011-212831 A | | 10/2011 | |
| JP | 2011212831 A | * | 10/2011 | ............ B25J 9/1676 |
| JP | 2002-331478 A | | 11/2012 | |
| JP | 2013-129018 A | | 7/2013 | |
| JP | 2014213399 A | | 11/2014 | |
| WO | 2009/072383 A1 | | 4/2011 | |
| WO | 2011/080882 A1 | | 5/2013 | |

OTHER PUBLICATIONS

Smith, Christian et al., "Robot Manipulators", Dec. 2009, IEEE Robotics & Automation Magazine, IEEE. (Year: 2009).*

* cited by examiner

FIG. 6

VARIATION AMOUNT IN DRIVE AXIS WHEN EMERGENCY STOP IS PERFORMED

|  |  | WEIGHT OF WORK TOOL | | | | |
|---|---|---|---|---|---|---|
|  |  | 10kg | 20kg | 30kg | 40kg | 50kg |
| OPERATING SPEED IN DRIVE AXIS | 10deg/s | 5deg | 6deg | 7deg | 8deg | 9deg |
|  | 20deg/s | 6deg | 7deg | 8deg | 9deg | 10deg |
|  | 30deg/s | 7deg | 8deg | 9deg | 10deg | 11deg |
|  | 40deg/s | 8deg | 9deg | 10deg | 11deg | 12deg |
|  | 50deg/s | 9deg | 10deg | 11deg | 12deg | 13deg |

ROBOT SIMULATION APPARATUS THAT CALCULATES SWEPT SPACE

RELATED APPLICATIONS

The present application claims priority to Japanese Patent Application Number 2016-027905, filed Feb. 17, 2016, the disclosure of which is hereby incorporated by reference herein in its entirety.

BACKGROUND OF THE INVENTION

1. Field of the Invention

The present invention relates to a robot simulation apparatus.

2. Description of the Related Art

A robot can perform a predetermined operation such as transporting or welding a work by changing its position and posture. Since the robot changes the position and the posture depending on the operation, a fence is sometimes provided around a robot system including the robot in order to limit the operator's access. The fence around the robot system is located apart from the robot to prevent the robot from contacting the fence during the operation of the robot. In order to determine such a location of the fence, it is preferable to acquire beforehand a swept space through which a component of the robot can pass when the robot operates. The fence can be located out of contact with the swept space.

Japanese Unexamined Patent Publication No. 2014-213399 discloses a method that teaches a teaching point by the operator gripping a manipulator end by hand and manually operating the manipulator while controlling a robot teaching system. This robot teaching method discloses that the space around the robot is swept by the body of the manipulator and information of the swept space is recorded in the robot teaching system. Further, this method discloses that the swept space is used for the teaching operation.

SUMMARY OF THE INVENTION

A robot sometimes performs an emergency stop during operation. For example, a robot control apparatus performs the emergency stop of a robot when it is detected that the robot comes in contact with a person. Alternatively, the operator depresses an emergency stop button, whereby the robot control apparatus causes the robot to stop instantly.

The robot includes a drive axis and a component such as an arm and the like is driven based on the drive axis. The component of the robot is driven by the motor. The motor is provided with a brake so as to prevent rotation of the output shaft of the motor. When supply of electricity to the motor is interrupted, the brake operates so as to maintain the position and the posture of the robot.

When the robot performs the emergency stop, the brake operates, but the robot is further moved from the position and the posture at which control for emergency stop is carried out by inertia of the robot, and then stopped. As such, when the emergency stop is performed during a time period for which the robot is being driven based on an operation program, the robot is sometimes stopped at the position departed from the normal path when the operation program is executed.

Thus, when a fence is located around the robot system, it is necessary to take into account of not only the area through which the robot passed based on the operation program but also the area departed from the normal path upon execution by the robot of the emergency stop. The fence needs to be located so as not to interfere with the area departed from the normal path. In the prior art, the fence surrounding the robot system has been located sufficiently apart from the robot system. Therefore, there has been a case in which the working area of the robot system is excessively large. Alternatively, when the amount of prediction for operation upon the emergency stop of is small, there has been a case in which the working area of the robot system is decreased so that the robot contacts the fence when the robot performs the emergency stop.

In Japanese Unexamined Patent Publication No. 2014-213399 referred to above, it is proposed to acquire a swept space when a robot is operated, but no consideration is given to deviation from a normal path of the robot due to the emergency stop.

The simulation apparatus of the present invention is a simulation apparatus in which three-dimensional models of a robot and a work tool attached to the robot are located in the same space and simulation of the robot is carried out. The simulation apparatus comprises a weight acquisition part that acquires the weight of the work tool. The simulation apparatus comprises a position acquisition part that acquires the position in each drive axis of the robot at a set point set for each minute section of a motion path of the robot when an operation program of the robot is executed. The simulation apparatus comprises a speed acquisition part that acquires an operating speed in each drive axis at the set point. The simulation apparatus comprises a stop position estimation part that estimates a stop position where the robot is stopped after moving by inertia in each dive axis based on the position in each drive axis of the robot, the operating speed in each drive axis, and the weight of the work tool when the robot performs an emergency stop at the set point. The simulation apparatus comprises a swept space calculation part that computes a swept space of three-dimensional model of the robot and the work tool based on the stop position.

In the present invention, the simulation apparatus may comprise a variation amount acquisition part acquiring a variation amount in the drive axis from the time at which the emergency stop is performed to the time at which the robot is stopped in the state in which the work tool with a predetermined weight is attached to the robot when the robot performs the emergency stop during a time period for which the robot is driven in a predetermined direction and at a predetermined operational speed in one drive axis. The variation amount acquisition part can acquire a relationship of the variation amount in the drive axis to the weight of the work tool and the operating speed in the drive axis by changing the weight of the work tool and the operating speed in the drive axis and repeatedly performing the emergency stop of the robot. The stop position estimation part can estimate a stop position in the drive axis based on the relationship of the variation amount in the drive axis to the weight of the work tool and the operating speed in the drive axis.

BRIEF DESCRIPTION OF THE DRAWINGS

FIG. 6 is a view for explaining a variation amount in one drive axis after an emergency stop of the robot is performed.

DETAILED DESCRIPTION

Referring to FIG. 1 through FIG. 11, description will be made of a simulation apparatus in an embodiment.

The simulation apparatus of the present embodiment calculates a swept space when the robot performs an emergency stop by implementing a simulation of the robot.

Figure 1:
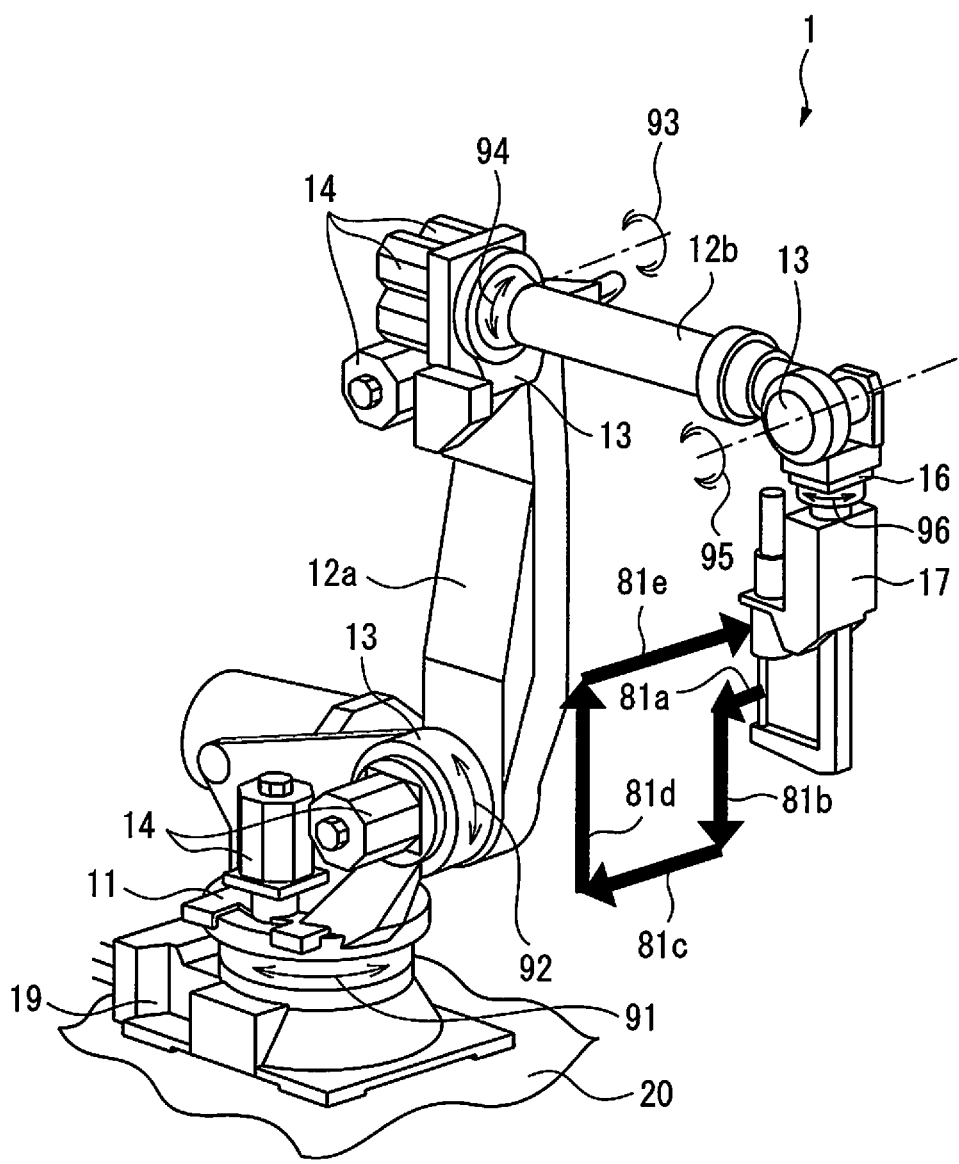
FIG. 1 is a perspective view of a robot of first robot system in an embodiment.

FIG. 1 is a perspective view of a robot of first robot system which implements the simulation in the present embodiment. The robot system comprises a work tool 17 that performs a predetermined work, and the robot 1 that changes a position and a posture of the work tool 17. The robot 1 of the present embodiment is an articulated robot including arms 12a and 12b, a wrist part 16, and a plurality of joint parts 13. Components such as power supply box, cables and the like are included in the robot 1.

The robot 1 of the present embodiment comprises six drive axes. A rotation part 11 rotates based on first drive axis as indicated by arrows 91. The arms 12a and 12b rotate based on second drive axis, third drive axis and fourth drive axis as indicated by arrows 92 to 94. The wrist part 16 rotates based on fifth drive axis as indicated by arrows 95. The work tool 17 rotates based on sixth drive axis as indicated by arrows 96.

The robot 1 includes a robot drive device that drives a component at each joint part 13. The robot drive device includes motors 14 for driving components at the joint parts 13. The motor 14 is driven so that arms 12a and 12b and the wrist part 16 can be oriented in a desired direction at the joint parts 13. The robot 1 comprises a base part 19 fixed on a floor surface 20, and the rotation part 11 that rotates with respect to the base part 19. The robot drive device includes the motor 14 for driving the rotation part 11.

The work tool 17 attached to the robot 1 is referred to also as end-effector. The work tool 17 is attached to the wrist part 16 of the robot 1. The work tool 17 of the present embodiment is a welding gun for performing spot welding but, not limited to this aspect, any work tool can be coupled to the robot depending on the contents of the work. The work tool 17 includes a tool drive device 18 for driving the work tool 17. The tool drive device 18 of the present embodiment includes an electric circuit that supplies electricity to electrodes.

Figure 2:
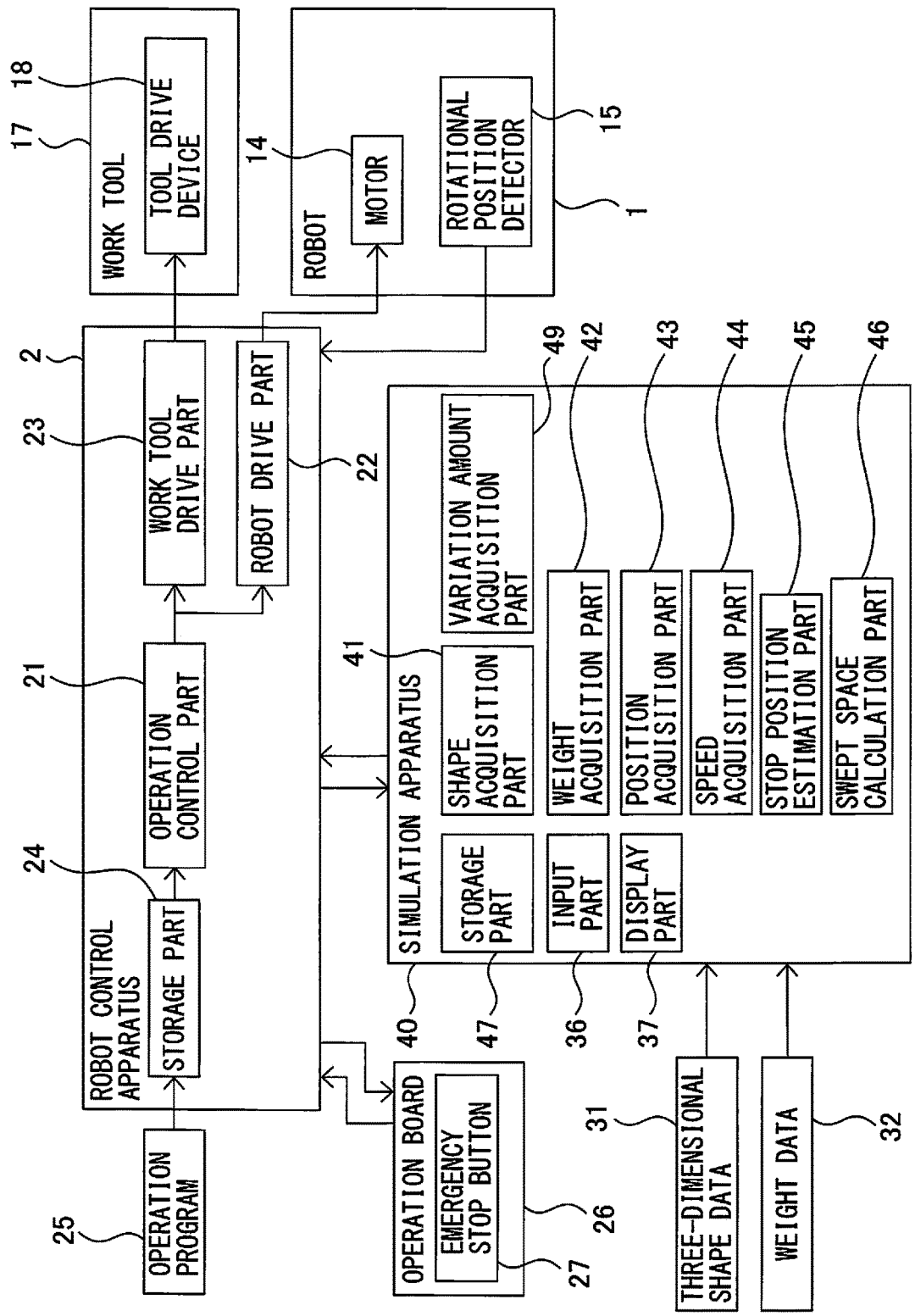
FIG. 2 is a block diagram of the first robot system in the embodiment

FIG. 2 shows a block diagram of the robot system in the present embodiment. Referring to FIG. 1 and FIG. 2, the robot system comprises a robot control apparatus 2 that controls the robot 1. The robot control apparatus 2 includes an arithmetic processing apparatus having CPU (Central Processing Unit), RAM (Random Access Memory), ROM (Read Only Memory) and the like, which are connected to one another via a bus.

The robot control apparatus 2 includes a storage part 24 that stores information relating to the control of the robot 1 and the work tool 17. The robot control apparatus 2 can drive the robot 1 based on a previously inputted operation program 25. The operation program 25 is stored in the storage part 24.

The robot control apparatus 2 includes an operation control part 21. The operation control part 21 sends out an operation command for driving the robot 1 and the work tool 17. The operation control part 21 sends an operation command for driving the robot 1 to a robot drive part 22. The robot drive part 22 includes an electric circuit for driving a motor 14 of the robot 1. The robot drive part 22 supplies electricity to the motor 14 that drives an arm or the like based on the operation command. Further, the operation control part 21 sends an operation command for driving the work tool 17 to a work tool drive part 23. The work tool drive part 23 includes an electric circuit for driving the tool drive device 18. The work tool drive part 23 supplies electricity to the tool drive device 18 based on an operation command.

The robot 1 comprises a state detector that detects a state of the component of the robot 1. The state detector of the present embodiment includes a rotational position detector 15 attached to the motor 14 in each drive axis. The rotational position detector 15 detects a rotational position when the motor 14 is driven. Information of the rotational position detected by the rotational position detector 15 is sent to the robot control apparatus 2. The robot control apparatus 2 can detect a rotational speed based on the rotational position in each drive axis. Further, the robot control apparatus 2 can detect a position and a posture of the component of the robot 1 based on the rotational position of each motor 14.

The robot system includes an operation board 26 which enables the operator to input predetermined information to the robot control apparatus 2 and displays a status of work. The operation board 26 of the present embodiment is provided with an emergency stop button 27 for enabling the operator to stop the robot 1 urgently.

The robot 1 of the present embodiment is configured to perform the emergency stop during the operation based on the operation program 25 when a predetermined condition is satisfied. For example, the robot control apparatus 2 performs the emergency stop of the robot 1 in response to the operator depressing the emergency stop button 27. Alternatively, when the operation control part 21 detects an abnormality of the robot 1 or the work tool 17, the robot control apparatus 2 performs the emergency stop of the robot 1.

The robot drive apparatus of the present embodiment includes a brake that stops movement in each drive axis. The brake is, for example, configured to stop rotation of an output shaft of the motor 14. The brake of the present embodiment is mounted to the motor 14. The brake is controlled by the operation control part 21 of the robot control apparatus 2.

The operation control part 21 causes the robot 1 to stop instantly when it receives an emergency stop signal to perform the emergency stop. In the control of the emergency stop, the operation control part 21 sends a stop command to the motor 14 for an operating drive axis of the robot 1. In other words, the operation control part 21 outputs a null movement command to the operating drive axis and the motor 14 of the robot 1 stops. Further, the operation control part 21 actuates the brake of the motor 14. The output shaft of the motor 14 is braked by the brake.

Figure 3:
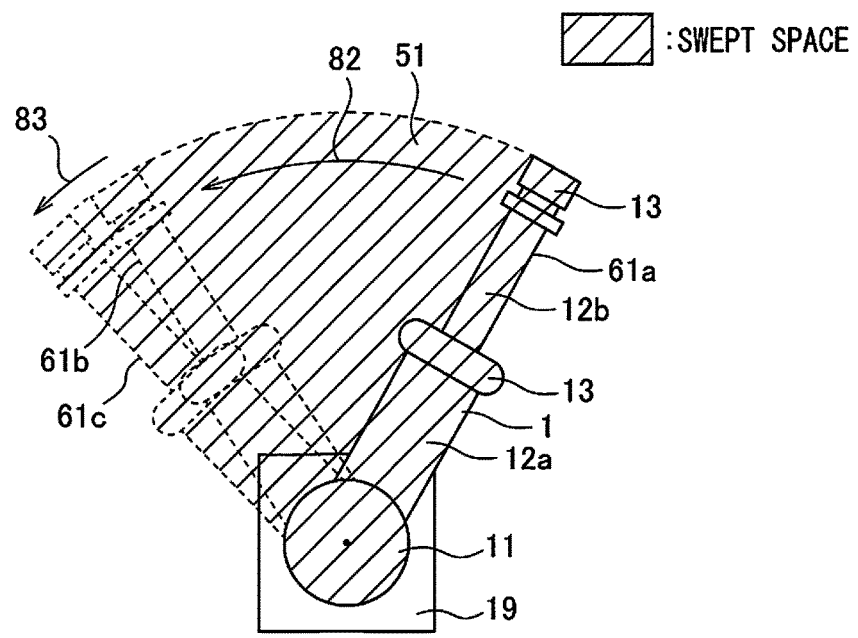
FIG. 3 is first schematic plan view of the robot for explaining the swept space.

FIG. 3 shows a schematic view explaining an operation of the robot when the emergency stop of the robot is executed. FIG. 3 is a view of the robot 1 as viewed from above. In the example illustrated in FIG. 3, a state is illustrated in which the rotation part 11 has rotated about the first drive axis. The rotation of the rotation part 11 in turn rotates the arms 12a and 12b and the work tool 17.

The arms 12a and 12b and the work tool 17 are moved from an initial position 61a as indicated by an arrow 82. Further, the emergency stop is performed at a position 61b of the robot 1. The supply of electricity to the motor 14 for the first drive axis of the robot 1 is stopped. Further, the brake of the motor 14 for the first drive axis is actuated. However, due to inertia, the robot 1 is not stopped at the position and the posture when the operation control part 21 issues a stop command, i.e., when the emergency stop is performed. The robot 1 continues the movement by inertia as indicated by an arrow 83. Then, the robot 1 is completely stopped at a position 61c of the robot 1.

In the present embodiment, a space in which a movable member such as component or the like of the robot 1 is moved is referred to as swept space. The swept space corresponds to a pass area which is an area through which a predetermined member passed. When the emergency stop of the robot 1 is performed, the robot 1 moves further than the position where the stop command was issued. The swept space 51 in this example includes an area through which the arms 12a, 12b, the wrist part 16, and the work tool 17 passed as indicated by the arrow 83.

Figure 4:
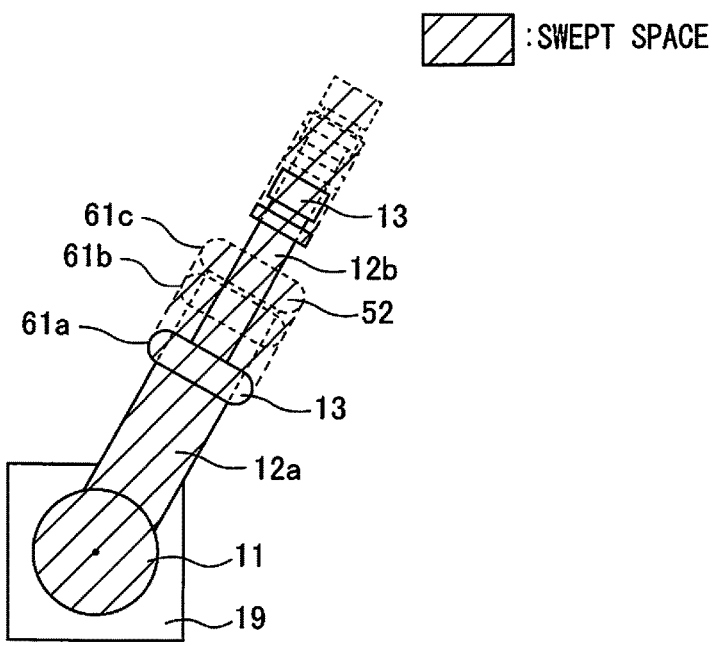
FIG. 4 is second schematic plan view of the robot for explaining a swept space.

FIG. 4 shows a schematic view explaining another operation of the robot when the emergency stop of the robot in the present embodiment is performed. FIG. 4 is a view of the robot 1 as viewed from above. In the example illustrated in FIG. 4, the arm 12a is moved about the second drive axis. The arm 12b is moved outward from the initial position 61a of the robot 1, and the position and the posture of the arms 12a and 12b are also changed. The emergency stop is performed during the movement of the arm 12a. The emergency stop of the robot 1 is performed at the position 61b. Further, due to the inertia of the robot 1, the position and the posture of the arms 12a and 12b are changed to the position 61c of the robot 1. The swept space 52 in this example includes an area through which the arms 12a, 12b, the wrist part 16, and the work tool 17 passed after the emergency stop is performed.

Referring to FIG. 2 and FIG. 3, the swept spaces 51 and 52 when the emergency stop of the robot is performed become a space including the movement of the robot 1 by inertia. The swept spaces 51 and 52 are constituted by an area through which the robot 1 passed from the initial position 61a to the position 61c where the robot 1 is stopped.

Referring to FIG. 1 and FIG. 2, the robot system in the present embodiment comprises a simulation apparatus 40. The simulation apparatus 40 performs a simulation of the robot 1, with a three-dimensional model of the robot 1 and the work tool 17 disposed in the same space.

The simulation apparatus 40 is composed of an arithmetic processing apparatus including CPU or the like. The simulation apparatus 40 comprises a storage part 47 that stores any information relating to simulation of the robot system. Three-dimensional shape data 31 of the robot 1 and the work tool 17 is inputted to the simulation apparatus 40. The three-dimensional shape data 31 may use data outputted from, for example, a CAD (Computer Aided Design) apparatus. The three-dimensional shape data 31 is stored in the storage part 47. Weight data 32 including the weight of the work tool 17 is inputted to the simulation apparatus 40. The weight data 32 is stored in the storage part 47.

The simulation apparatus 40 comprises a shape acquisition part 41 that acquires three-dimensional shape data of a moving member such as the robot 1, the work tool 17, and the like. The simulation apparatus 40 comprises a weight acquisition part 42 that acquires the weight of the work tool 17. Further, the simulation apparatus 40 comprises a position acquisition part 43 that acquires a position in each drive axis of the robot 1, and a speed acquisition part 44 that acquires an operating speed in each drive axis. The position acquisition part 43 of the present embodiment can acquire positions in all drive axes. The speed acquisition part 44 can acquire operating speeds in the all drive axes. Further, the simulation apparatus 40 comprises a stop position estimation part 45 that estimates a stop position where the robot is stopped after moving by inertia in each axis, when the emergency stop of the robot 1 is performed. The simulation apparatus 40 comprises a swept space calculation part 46 that computes a swept space for the three-dimensional model of the robot 1 and the work tool 17 based on the stop position in each drive axis.

Figure 5:
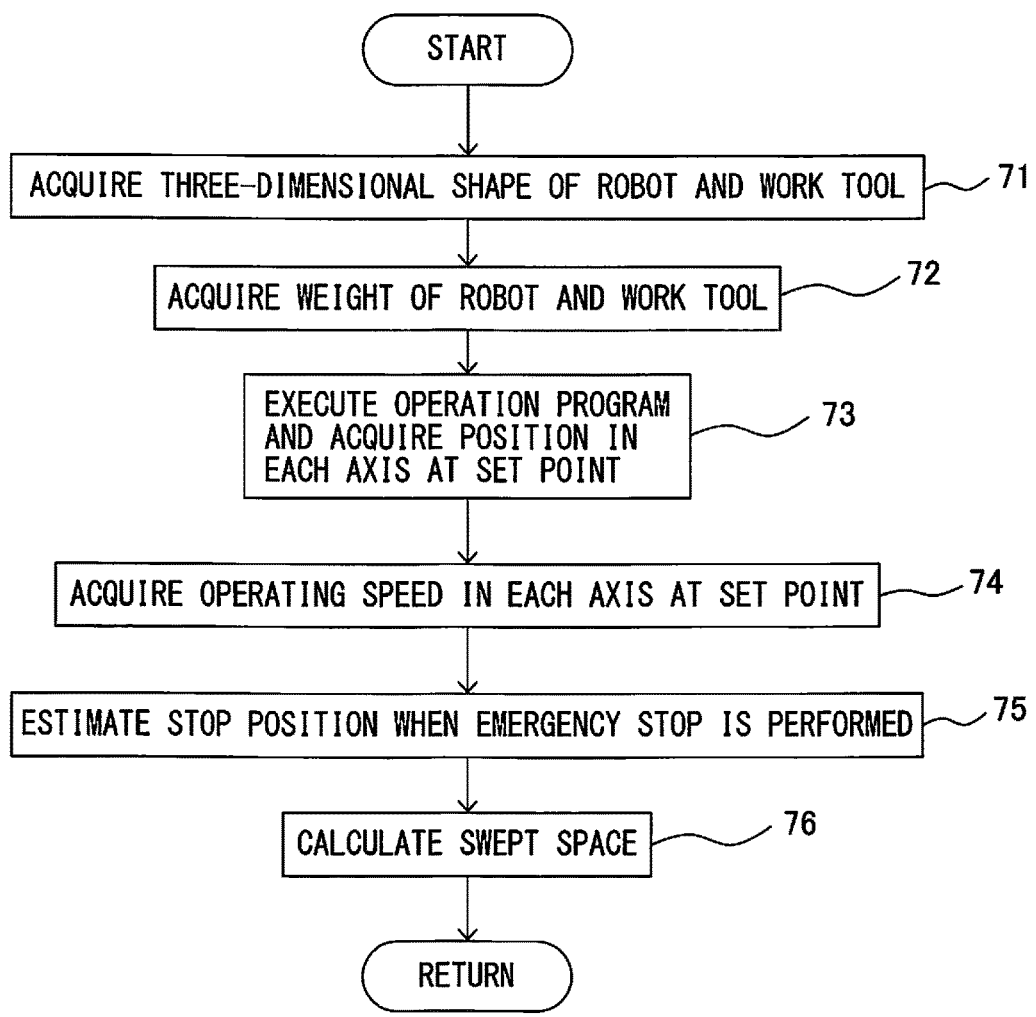
FIG. 5 is a control flow chart of a simulation apparatus in the embodiment.

FIG. 5 shows a flow chart for the control in the simulation apparatus of the present embodiment. Referring to FIG. 2 and FIG. 5, at step 71, the shape acquisition part 41 acquires three-dimensional shape data of the robot 1 and the work tool 17 from the storage part 47. Shape data of components configuring the robot 1 are included in the three-dimensional shape data of the robot 1. For example, shape data of the arms 12a, 12b, the work tool 17, and the like, which are moved by driving the robot 1, are included in the three-dimensional shape data of the robot 1. At step 72, the weight acquisition part 42 acquires the weight of the work tool 17 from the storage part 47.

At step 73, the position acquisition part 43 acquires the position in each drive axis of the robot 1 at a set point set on a motion path of the robot 1. The motion path can exemplify, for example, as path of a tool tip point. The operation control part 21 sends out an operation command at each predetermined control cycle (interpolation cycle) of the robot. In the present embodiment, a point set for each control cycle is regarded as the set point. On the motion path, the set point is set for each minute section. The set point may be set for each minute time interval or for each minute distance on the motion path.

With regard to execution of the operation program, description is made herein of an example in which the robot 1 is actually driven. The operation control part 21 of the robot control apparatus 2 drives the robot 1 and the work tool 17 based on the operation program 25. The robot 1 changes its position and posture so as to follow the predetermined motion path.

The rotational position detector 15 detects a position in each drive axis in a period during which the robot 1 is driving. The rotational position detector 15 detects a rotational angle in the drive axis. The rotational position detector 15 detects a rotational angle for each control cycle of the robot 1 so as to correspond to the set point. The rotational position detector 15 sends out the rotational angle in the drive axis to the robot control apparatus 2. In the present embodiment, positions are detected in the all drive axes.

The position acquisition part 43 acquires the rotational angle in each drive axis from the robot control apparatus 2. The position acquisition part 43 acquires the rotational angle in the drive axis for each control cycle corresponding to the set point and stores it in the storage part 47. In this manner, the position acquisition part 43 acquires the position in each drive axis of the robot which corresponds to the set point set for each minute section of the motion path of the robot 1.

When acquiring the position in each drive axis, for example, the simulation apparatus may perform simulation of executing the operation program, and the position acquisition part may acquire the position in each drive axis of the robot at the set point based on a result of the simulation.

Subsequently, at step 74, the speed acquisition part 44 acquires the operating speed in each drive axis at the set point. The speed acquisition part 44 can calculate an angle of rotation from the positions in the drive axis corresponding to set points contiguous with each other, and can calculate the operating speed in the drive axis based on the calculated angle and the control cycle. Alternatively, there is a case in which the rotational position detector 15 has the function of calculating the operating speed. In such a case, the operating speed outputted from the rotational position detector 15 is sent to the robot control apparatus 2. The speed acquisition part 44 may acquire the operating speed in the drive axis from the robot control apparatus 2.

Subsequently, at step 75, the stop position estimation part 45 estimates the stop position in each drive axis when the emergency stop of the robot is performed at the set point. The components of the robot 1 are moved by inertia even after the emergency stop is performed. In the present embodiment, a relationship of the variation amount due to inertia in the drive axis to the weight of the work tool 17 and the operating speed in the drive axis is determined beforehand, and the storage part 47 stores the relationship. Further, the stop position estimation part 45 estimates the stop position in each drive axis based on the relationship of the variation amount for the drive axis to the weight of the work tool and the operating speed in the drive axis.

Referring to FIG. 2, the simulation apparatus 40 comprises a variation amount acquisition part 49 that acquires a variation amount for the drive axis from the time in which the emergency stop of the robot 1 is performed to the time in which the robot 1 is completely stopped.

FIG. 6 shows a table of variation amount for the drive axis when the emergency stop of the robot is performed in one drive axis. This table indicates the amounts of change for the drive axis when the emergency stop is performed in one drive axis in the period during which the robot 1 is driving in a predetermined direction and at a predetermined operating speed. The variation amount for the drive axis corresponds to the angle of rotation from the time in which the emergency stop is performed to the time in which the robot 1 is completely stopped.

The variation amount for the drive axis becomes a function of the operating speed in the drive axis and the weight of the work tool. The heavier the work tool 17, the larger the variation amount for the drive axis after the emergency stop is performed. Further, the higher the operating speed in the drive axis when the emergency stop is performed, the larger the variation amount for the drive axis.

In the present embodiment, the variation amount for the drive axis illustrated in FIG. 6 is determined by actually driving the robot 1. The operator attaches a work tool 17 having a predetermined weight to the robot 1. Then, the operator selects one drive axis as a specific drive axis. The operator drives the robot 1 in the specific drive axis in the predetermined direction and at the predetermined operating speed. Then, the operator performs the emergency stop during a period for which the robot 1 is driven. Thereupon, the variation amount acquisition part 49 detects the position in the specific drive axis when the emergency stop is performed and the position in the specific drive axis when the robot 1 is stopped. The variation amount acquisition part 49 can acquire a difference between positions in the specific drive axis as the variation amount in the specific drive axis.

For example, the operator attaches a work tool 17 of 10 kg to the robot 1. Then, the robot 1 is driven so that the speed in the selected specific drive axis becomes 10 deg/s. When the speed is 10 deg/s, the emergency stop is performed. The variation amount acquisition part 49 detects an output of the rotational position detector 15 when the emergency stop is performed. The variation amount acquisition part 49 also detects an output of the rotational position detector 15 when the robot 1 is stopped. The variation amount acquisition part 49 can calculate the variation amount for the drive axis of 5 deg by subtracting the rotation angle when the emergency stop is performed from the rotation angle when the robot 1 is completely stopped.

The operator can acquire a relationship of the variation amount for the specific drive axis to the operating speed in the specific drive axis and the weight of the work tool by changing the weight of the work tool attached to the robot 1 and the operating speed in the drive axis and repeating a similar measurement. The operator may prepare beforehand an operation program of the robot 1 for acquiring the variation amount for the specific drive axis and drive the robot 1 using this operation program.

The relationship of the variation amount for the drive axis to the operating speed in the drive axis and the weight of the work tool can be calculated for each drive axis. By performing a measurement similar to that described above also at the another drive axis, it is possible to acquire the relationship of the variation amount for the drive axis to the operating speed in the drive axis and the weight of the work tool for all the drive axes. For example, the robot 1 in the present embodiment includes six drive axes. As such, the operator can prepare beforehand six tables such as illustrated in FIG. 6 for the respective drive axes.

In this manner, the variation amount acquisition part 49 can acquire the relationship of the variation amount in the drive axis to the weight of the work tool 17 and the operating speed in the drive axis by repeatedly performing the emergency stop of the robot 1 while changing the weight of the work tool 17 and the operating speed in the drive axis. The relationship can be stored in the storage part 47.

Referring to FIG. 2, the stop position estimation part 45 calculates a variation amount in the drive axis when the emergency stop is performed at a predetermined set point using the relationship of the variation amount illustrated in FIG. 6. The calculation of the variation amount when the emergency stop is performed can be performed for each drive axis.

When the weight of the work tool and the operating speed in the drive axis at the set point are different from previously acquired measurement values, the stop position estimation part 45 can calculate a variation amount by interpolating or extrapolating a plurality of the variation amount. For example, the estimation can be performed by interpolating the variation amount after selecting measurement values at opposite sides of the value at the set point. Referring to FIG. 6, when the weight of the work tool 17 is 25 kg, it is possible to calculate a variation amount when the weight of the work tool 17 is 25 kg by interpolating a variation amount when the weight of the work tool 17 is 20 kg and a variation amount when the weight of the work tool 17 is 30 kg.

Alternatively, the variation amount in the drive axis may be set to be great by taking safety into account so that the robot 1 is prevented from colliding with a fence or the like.

In this case, it is possible to select the operating speed in the drive axis which is higher than the operating speed at the set point. Alternatively, it is possible to select a weight greater than the actual weight of the work tool. For example, when the weight of the work tool 17 is 25 kg, it is possible to select a variation amount when the weight of the work tool 17 is 30 kg. In other words, a variation amount for the drive axis can be estimated based on a weight of the work tool greater than the actual weight of the work tool or an operating speed in the drive axis higher than the actual operating speed in the drive axis.

The stop position estimation part 45 can calculate a stop position in the drive axis when the robot 1 is stopped by adding a variation amount in the drive axis to the position in the drive axis when the emergency stop is performed. The calculation of the stop position in the drive axis can be performed for each drive axis.

The robot 1 is in a state in which two or more drive axes are driven simultaneously in some cases. Even in such cases, the set points are set at a predetermined interval. Hence, a variation amount for a drive axis when the emergency stop is performed at the set point is calculated for each drive axis. Thus, the stop position estimation part 45 can calculate a position where the robot is stopped for respective plurality of drive axes. The position and the posture of the robot when the robot 1 is stopped are determined by the positions in the plurality of drive axes.

In this manner, the stop position estimation part 45 estimates the stop position in each drive axis when the robot 1 is completely stopped. There is a case in which an operable range is previously set for the drive axis. For example, there is a case in which the drive axis is formed to be operable within a predetermined range of rotational angle. When a variation amount in the drive axis is added to a position when the emergency stop is performed, there is a case in which the stop position in the drive axis is beyond the operable range in the drive axis. In this case, the stop position estimation part 45 can set the limit position of the operable range to the stop position in the drive axis.

In the above embodiment, the robot is actually driven to acquire the relationship of the variation amount in the drive axis to the operating speed in the drive axis and the weight of the work tool, but this is by no means limitative, and the variation amount in the drive axis may be calculated by a simulation. Such simulation can be performed based on the shape of the component, the weight of the component, the braking distance of a decelerator, and the like. For example, the stop position estimation part may estimate a position where the robot is completely stopped when the emergency stop is performed by the simulation.

Referring to FIG. 5, subsequently at step 76, the swept space calculation part 46 calculates the swept space for the three-dimensional model of the robot 1 and the work tool 17 based on the stop position in the drive axis. At each set point, the stop position in the drive axis is determined. The swept space calculation part 46 can calculate the position and the posture of the robot 1 based on the stop position in each drive axis. The swept space calculation part 46 can calculate a three-dimensional model of the position and the posture of the component which configures the robot system.

The swept space calculation part 46 creates the three-dimensional model of the robot 1 and the work tool 17 corresponding to each set point when the robot 1 is driven based on the operation program 25. Subsequently, the swept space calculation part 46 adds a three-dimensional model of the robot 1 and the work tool 17 corresponding to a stop position when the emergency stop is performed. Then, the swept space calculation part 46 can create a swept space by connecting the contours of these three-dimensional models to each other.

Figure 7:
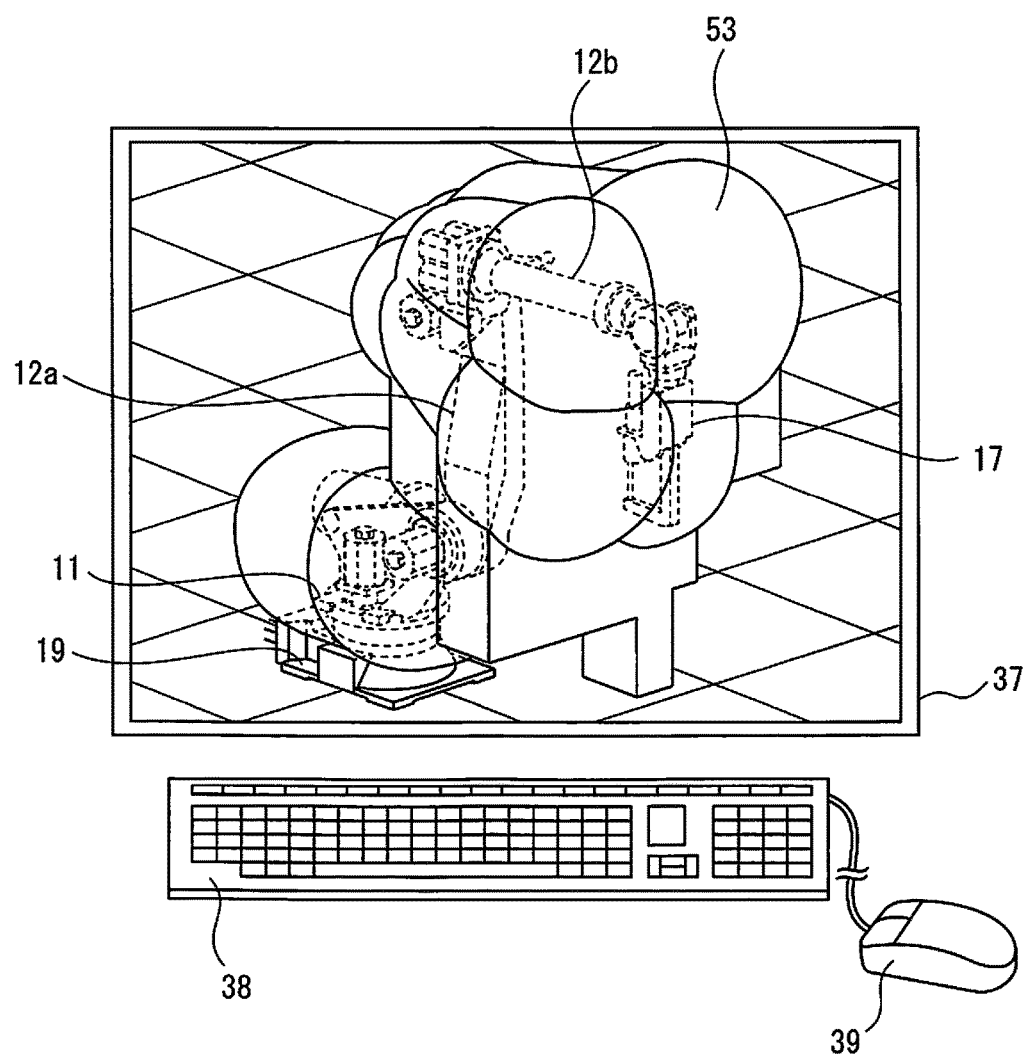
FIG. 7 is a schematic view of the simulation apparatus displaying the swept space.

FIG. 7 shows an example of the swept space when a simulation is performed by the simulation apparatus in the present embodiment. The simulation apparatus 40 of the present embodiment comprises a display part 37 that displays a result of the performed simulation. Further, the simulation apparatus 40 comprises a keyboard 38 and a mouse 39 as an input part 36 for inputting predetermined information and manipulating an image.

Referring to FIG. 1, the robot 1 can move in predetermined directions as indicated by, for example, arrows 81a, 81b, 81c, 81d, and 81e. Then, the position and the posture of the robot 1 are changed during each operation. Referring to FIG. 7, a swept space 53 calculated based on the operation of the robot 1 is displayed on the display part 37. The swept space 53 includes the area through which the component passes when driven based on the operation program and additionally the area though which the component passes when the emergency stop is performed at any set point. The swept space 53 becomes greater than the swept space when the robot 1 is moved based on the operation program.

In this manner, the swept space calculation part 46 creates the three-dimensional model of the component corresponding to the stop position based on the stop position after the robot 1 has performed the emergency stop. Further, the swept space calculation part 46 can form the swept space 53 by joining the three-dimensional models together.

The operator can arrange other devices and the fence in a manner not to contact the estimated swept space 53. For example, the operator can determine a position for the fence around the robot 1 in a manner not to contact the swept space 53. The swept space 53 calculated by the simulation apparatus 40 includes the area in which the robot 1 moves by inertia after the emergency stop is performed. As such, the operator can arrange the fence at an appropriate position in a manner such that the working area surrounded by the fence is not too large or too small. In other words, a safe area secured around the robot system can be appropriately sized.

In the above embodiment, a three-dimensional model is formed based on the position in the drive axis when the emergency stop is performed and the position in the drive axis when the robot is completely stopped. The simulation apparatus 40 further can estimate the motion path from the position where the emergency stop is performed to the position where the robot is completely stopped, and add a three-dimensional model corresponding to an intermediate point on the estimated motion path.

Figure 8:
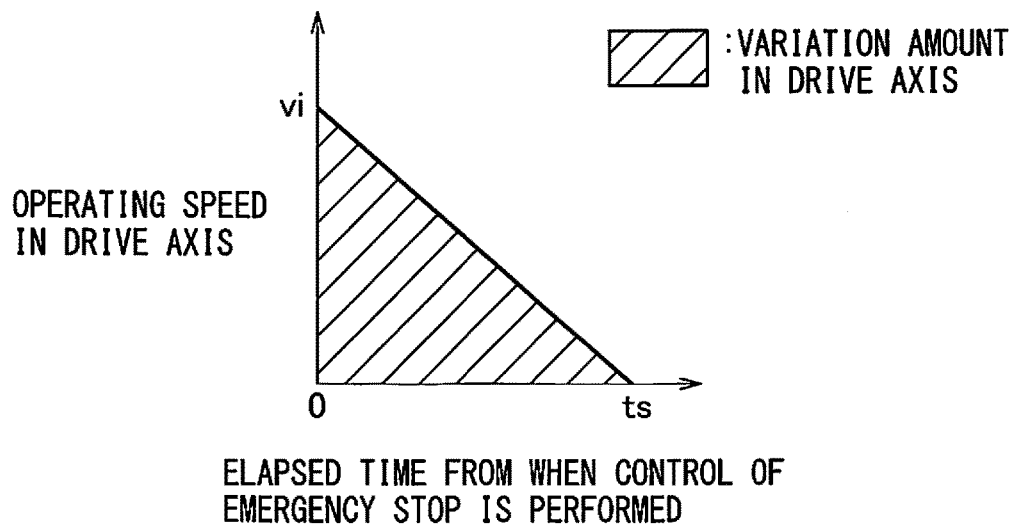
FIG. 8 is first graph representing a relationship between a lapse time from the time in which the emergency stop is performed and an operating speed in the drive axis.

FIG. 8 shows a graph explaining a relationship between an elapsed time from the time in which the emergency stop is performed and the operating speed in a preselected drive axis. A negative acceleration occurs until the operating speed in the drive axis becomes zero after the emergency stop is performed. In the present embodiment, it is assumed that the negative acceleration is constant. In other words, it is assumed that a gradient of the operating speed with respect to the elapsed time is constant.

In the example illustrated in FIG. 8, the emergency stop is performed when the elapsed time is zero. Speed vi is the operating speed in the drive axis when the emergency stop is performed. At the elapsed time ts, the operating speed in the drive axis is zero. At that time, the variation amount for the drive axis corresponds to the area surrounded by the graph, the operating speed axis, and the elapsed time axis.

Figure 9:
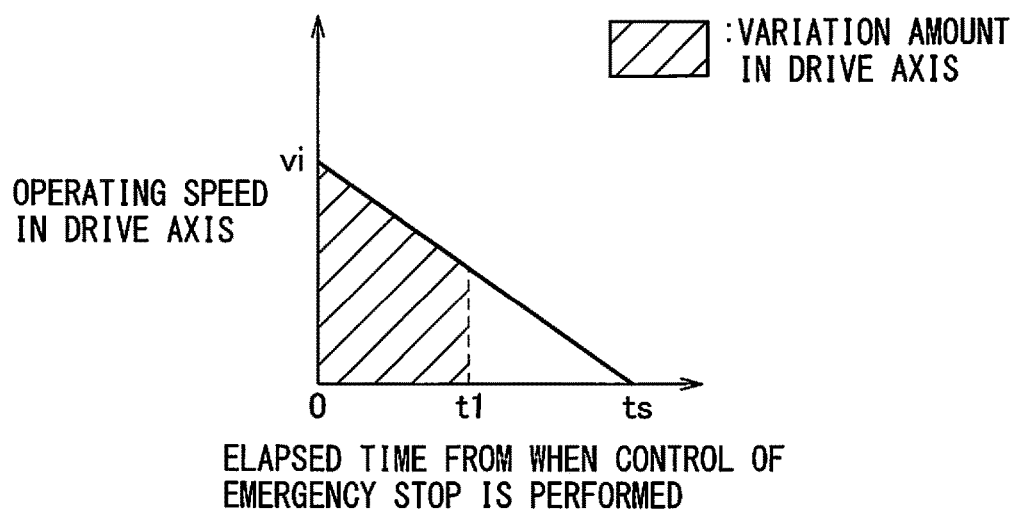
FIG. 9 is second graph representing a relationship between the lapse time from the time in which the emergency stop is performed and an operating speed in the drive axis.

FIG. 9 shows a graph explaining a control for estimating a variation amount in the drive axis. For example, the elapsed time t1 can be set during the period until the robot 1 is stopped. The variation amount from the time in which the emergency stop is performed to the elapsed time t1 corresponds to the area of a diagonally shaded trapezoidal portion. The stop position estimation part 45 can establish a new set point by dividing the motion path from the time in which the emergency stop is performed to the time in which the robot 1 is stopped. For example, it can establish a set point corresponding to the elapsed time t1. The stop position estimation part 45 can calculate a variation amount in the drive axis at the newly established set point based on the elapsed time from the time in which the emergency stop is performed. The stop position estimation part 45 can perform the calculation for each drive axis.

The swept space calculation part 46 can add the three-dimensional model of the robot 1 and the work tool 17 at the newly established set point and calculate a swept space. By performing this control, it is possible to more accurately calculate the swept space from the time in which the emergency stop is performed to the time in which the robot 1 is stopped.

During the time period from the time in which the emergency stop of the robot 1 is performed to the time in which the robot 1 is stopped, an arbitrary method can be adopted for the method of establishing the new set point. For example, while the new set point is added at a time which is half of the elapsed time ts in FIG. 9, there is no limitation to this aspect, and the elapsed time ts can be divided with an arbitrary time interval.

Further, while it is assumed that the operating speed for the drive axis is reduced at a constant acceleration in the present embodiment, there is no limitation to this aspect, and it may be configured so that the decreasing trend of the operating speed is acquired experimentally or the like in advance and the variation amount in the drive axis is calculated using the decreasing trend.

In the first robot system of the present embodiment, the robot 1 is secured to the floor surface 20. In the robot system, there is a case in which the robot 1 is placed on a support member and the support member is moved. In other words, in the robot system, there is a case in which the entire robot is moved. Further, there is a case in which the emergency stop is performed also with respect to the support member of the robot 1. In the following description, a robot system in which the entire robot is moved is explained.

Figure 10:
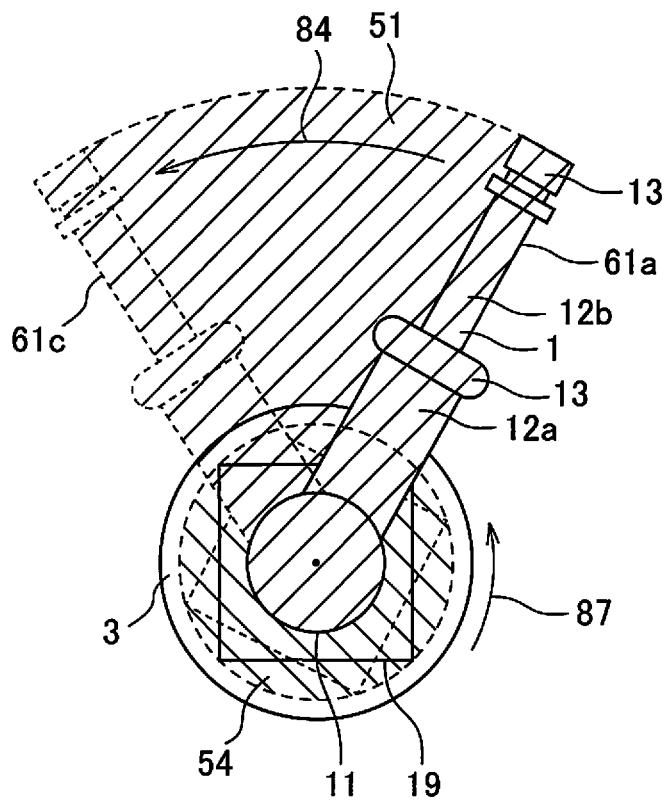
FIG. 10 is a schematic plan view of second robot system in the embodiment.

FIG. 10 shows a schematic plan view of second robot system in the present embodiment. The second robot system comprises a rotary table 3 serving as a support member to support the robot 1. The rotary table 3 is fixed to a floor surface. The base part 19 of the robot 1 is fixed to the rotary table 3. The rotary table 3 is configured to rotate the entire robot 1 about a predetermined rotation axis. In the example illustrated in FIG. 10, it is configured so that the rotary axis of the rotary table 3 coincides with the first drive axis of the rotation part 11 of the robot 1.

The rotary table 3 of the present embodiment is controlled by the robot control apparatus 2. A motor for driving the rotary table 3 is provided with a rotational position detector. Output of the rotational position detector is sent to the robot control apparatus 2.

In FIG. 10, there are illustrated an initial position 61a of the robot 1 when driving of the rotary table 3 is started, and a position 61c of the robot 1 when the rotary table 3 is completely stopped after an emergency stop of the rotary table 3 is performed. In the second robot system, even in a state in which the robot 1 is stopped, the robot 1 is rotationally moved by the rotary table 3 being driven. The simulation apparatus 40 can calculate a swept space when the rotary table 3 is driven based on the operation program and a swept space when the emergency stop of the rotary table 3 is performed by a method similar to that when the robot 1 is operated.

Three-dimensional shape data of the rotary table 3 is inputted to the simulation apparatus 40. The operator sets the rotary axis of the rotary table 3 as the drive axis. Further, the relationship of the variation amount in the drive axis to the operating speed in the drive axis and the weight of the work tool such as illustrated in FIG. 6 can be previously determined for the case in which the emergency stop is performed in the drive axis of the rotary table 3.

The simulation apparatus 40 can calculate a swept space when the rotary table 3 is operated in addition to the swept space when the robot 1 is operated. For example, even in a state in which the robot 1 is stopped, the arms 12a, 12b of the robot 1 are moved as indicated by an arrow 84 when the rotary table 3 is driven as indicated by an arrow 87.

The simulation apparatus 40 can calculate a swept space 54 by the base part 19 in addition to the swept space 51 by the rotation part 11, the arms 12a, 12b, the wrist part 16, and the work tool 17. In particular, the simulation apparatus 40 can calculate the entire swept space by adding the swept space when the rotary table 3 performs the emergency stop to the swept space when the robot 1 performs the emergency stop.

Figure 11:
FIG. 11 is a schematic plan view of third robot system in the embodiment.
Figure 11:
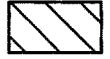
Figure 11:
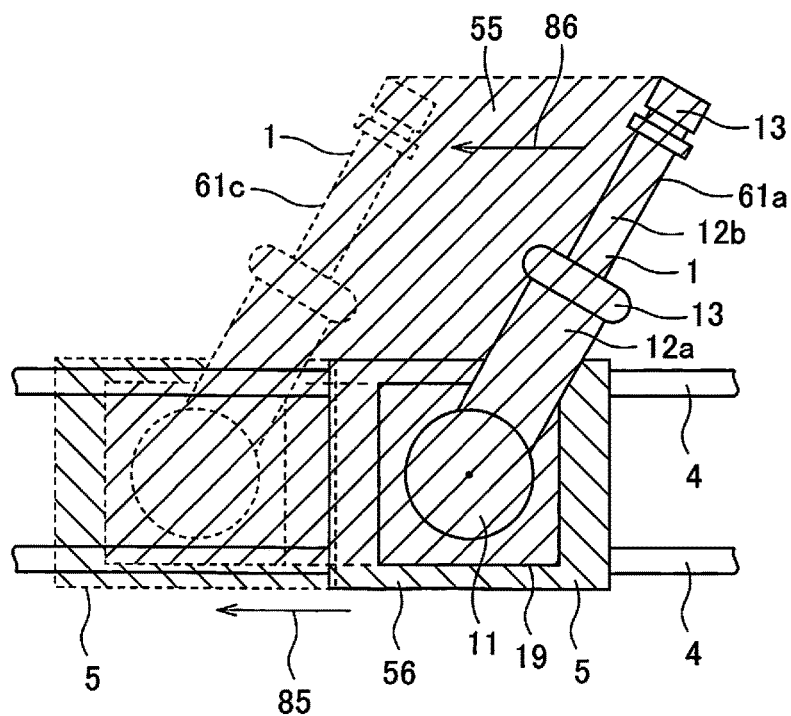

FIG. 11 shows a schematic plan view of third robot system in the present embodiment. The third robot system comprises a travel base 5 serving as the support member that supports the robot 1. The robot 1 is fixed to the travel base 5. The travel base 5 is configured to move along rails 4. The drive axis of the travel base 5 of the present embodiment is a linear motion axis.

The travel base 5 of the present embodiment is controlled by the robot control apparatus 2. A motor for driving the travel base 5 is provided with a rotational position detector. Output of the rotational position detector is sent to the robot control apparatus 2. The position of the travel base 5 can be calculated from the output of the rotational position detector.

In FIG. 11, there are illustrated an initial position 61a of the robot 1 when movement of the travel base 5 is started and a position 61c of the robot 1 when the travel base 5 is completely stopped after an emergency stop of the travel base 5 is performed.

In the third robot system, even in a state in which the robot 1 is stopped, the robot 1 is linearly moved by the travel base 5 being driven. The simulation apparatus 40 can calculate a swept space when the travel base 5 drives and a swept space when the travel base 5 performs the emergency stop by a method similar to that when the robot 1 is operated.

In the third robot system, three-dimensional shape data of the travel base 5 is inputted to the simulation apparatus 40. The operator sets the linear motion axis of the travel base 5 as the drive axis. Further, the relationship of the variation amount in the drive axis to the operating speed in the drive axis and the weight of the work tool such as illustrated in FIG. 6 can be previously determined for the case in which the travel base 5 performs the emergency stop.

The simulation apparatus 40 can calculate a swept space when the travel base 5 is operated in addition to the swept space when the robot 1 is operated. For example, even in a state in which the robot 1 is stopped, the robot 1 is moved as indicated by an arrow 86 when the travel base 5 is moved as indicated by an arrow 85. The simulation apparatus 40 can calculate a swept space 55 by the robot 1 and the work tool 17 and a swept space 56 by the travel base 5. In particular, the simulation apparatus 40 can calculate the entire swept space by adding the swept space when the travel base 5 performs the emergency stop to the swept space when the robot 1 performs the emergency stop.

In this manner, when the robot system comprises the support member that moves the robot 1, the simulation apparatus can set the drive axis for the support member and calculate the swept space when the support member performs the emergency stop. The swept space when the support member is operated can be calculated by adding the swept space when the emergency stop is performed to the swept space when the support member moves along the normal path.

The support member that moves the robot 1 is not limited to the above-described rotary table or travel base, but any support member capable of moving the entire robot 1 can be adopted.

The state detector in the present embodiment is a rotational position detector attached to each motor that detects a rotational angle, but is not limited to this aspect, and any detector capable of detecting a varying position in the drive axis is applicable. For example, when the drive axis is a linear motion axis, the state detector may include a linear scale or the like which detects the position of the component.

The simulation apparatus of the present embodiment is constituted by apparatus separate from the robot control apparatus, but there is no limitation to this aspect, and the robot control apparatus may include the function as the simulation apparatus. In other words, the robot control apparatus may include the simulation apparatus.

In the present embodiment, description has been made by exemplifying the articulated robot, but there is no limitation to this aspect, and the robot may include a single joint part.

According to the present invention, it is possible to provide the simulation apparatus that calculates the swept space of the robot when the robot performs the emergency stop.

In each control described above, the order of the steps may be appropriately changed within a scope that does not change the function and operation. Appropriate combinations of the above embodiments are possible. In each of the foregoing drawings, identical or equivalent parts are assigned with the same reference numerals. In addition, the above-described embodiments are by way of example only, and do not restrict the present invention in any way. Further, the embodiments include changes to the embodiments set forth in the claims.

The invention claimed is:

1. A simulation apparatus for performing simulation of a robot while three-dimensional models of the robot and a work tool attached to the robot are located in the same space, the simulation apparatus comprising:
 a programmed processor that:
  acquires a weight of the work tool,
  acquires a position in each drive axis of the robot at a set point set for each minute section of a motion path of the robot when an operation program of the robot is executed,
  acquires an operating speed in each drive axis at the set point,
  estimates a stop position where the robot is stopped after moving by inertia in each drive axis, based on the position in each drive axis of the robot, the operating speed in each drive axis, and the weight of the work tool, when an emergency stop of the robot is performed at the set point,
  adds a further set point between (i) the set point where the emergency stop of the robot is performed and (ii) the stop position, and
  calculates a swept space of the three-dimensional models of the robot and the work tool based on the operation program, the stop position and the further set point; and
 a display that displays the calculated swept space around the three-dimensional models of the robot and the work tool, wherein the displayed calculated swept space includes:
  an area through which the robot and the work tool move when driven based on the operation program, and
  an additional area through which the robot and the work tool move from the set point where the emergency stop of the robot is performed, through the further set point, to the stop position where the robot is stopped.

2. The simulation apparatus according to claim 1, wherein:
 the programmed processor further:
  acquires a variation amount in the drive axis from the time at which the emergency stop is performed to the time at which the robot is stopped in the state in which the work tool with a predetermined weight is attached to the robot when the robot performs the emergency stop during a time period for which the robot is driven in a predetermined direction and at a predetermined operating speed in one drive axis,
  acquires a relationship of the variation amount in the drive axis to the weight of the work tool and the operating speed in the drive axis by changing the weight of the work tool and the operating speed in the drive axis and repeatedly performing the emergency stop of the robot, and
  estimates the stop position in the drive axis based on the relationship of the variation amount in the drive axis to the weight of the work tool and the operating speed in the drive axis.

* * * * *